United States Patent [19]
Lovett

[11] Patent Number: 6,100,560
[45] Date of Patent: Aug. 8, 2000

[54] NONVOLATILE CELL

[75] Inventor: Simon J. Lovett, Milpitas, Calif.

[73] Assignee: Cypress Semiconductor Corp., San Jose, Calif.

[21] Appl. No.: 09/277,616

[22] Filed: Mar. 26, 1999

[51] Int. Cl.$^7$ ................................................ H01L 29/788
[52] U.S. Cl. ...................... 257/315; 257/321; 365/185.33
[58] Field of Search ..................... 257/314, 315, 257/318, 321, 355, 356, 357; 365/185.33, 162

[56] References Cited

U.S. PATENT DOCUMENTS

| | | | |
|---|---|---|---|
| 5,465,231 | 11/1995 | Ohsaki | 365/185.33 |
| 5,587,603 | 12/1996 | Kowshik | 257/316 |
| 5,719,427 | 2/1998 | Tong et al. | 257/315 |
| 5,844,271 | 12/1998 | Sethi et al. | 257/318 |
| 5,898,614 | 4/1999 | Takeuchi | 365/185.1 |
| 5,912,937 | 6/1999 | Goetting et al. | 377/67 |
| 5,969,382 | 10/1999 | Schlais et al. | 257/315 |

OTHER PUBLICATIONS

An EEPROM for Microprocessors and Custom Logic, By Roger Cuppens, Cornelis D. Hartgring, Jan F. Verwey, Herman L. Peek, Frans A.H. Vollebregt, Elisabeth G.M. Devens and Ingrid A. Sens, IEEE Journal of Solid–Staet Circuits, vol. SC–20, No. 2, Apr. 1985, pp. 603–608.

*Primary Examiner*—Donald L. Monin, Jr.
*Attorney, Agent, or Firm*—Christopher P. Maiorana, P.C.

[57] ABSTRACT

A nonvolatile cell comprising a first device comprising a first transistor type and a second device comprising a second transistor type. The first device may have a gate, a source, a drain and a gate oxide layer over the gate. The second device may have a gate, a source, a drain and a floating gate formed between the gate of said first device and the gate of the second device. The floating gate may be configured to store a charge in response to (i) a first voltage applied to the source and drain of said first device and (ii) a second voltage applied to the source and drain of the second device.

19 Claims, 4 Drawing Sheets

$$Q_1 = Q_2$$
$$C(V_{CG} - V_{FG}) = c(V_{FG})$$
$$\Rightarrow V_{FG} = \frac{C}{c+C} * V_{CG}$$

VSG = VNWELL = 7.5V
VS = VD = VO = 8.0V
10mS 6,100,560

1

NONVOLATILE CELL

FIELD OF THE INVENTION

The present invention relates to nonvolatile cells generally and, more particularly, to a nonvolatile cell in a logic process.

BACKGROUND OF THE INVENTION

Referring to FIG. 1A, a conventional implementation of a nonvolatile cell 10 in a logic process is shown. The cell 10 was described in a Journal article "An EEPROM for Microprocessors and Custom Logic", IEEE JSSC, Vol. sc-20, No. 2, April 1985, which is hereby incorporated by reference in its entirety. The nonvolatile cell 10 consists of an n-channel transistor 12, an n-channel transistor 14 and an n-channel transistor 16, which together comprise the nonvolatile element. The transistors 14 and 16 comprise the capacitor structure which generates the floating gate storage element, while the transistor 12 is a select device which has a twofold purpose. In the first instance, where the bitline terminal BL represents a memory bitline (i.e., a common terminal shared by many memory cells, maybe 1000 or more), small leakage currents in unselected cells can add together to disrupt the small read current obtained from the selected cell resulting in an invalid read. In the second instance, again where the bitline terminal BL is shared between many cells, during programming or erasing, an unintentional programming of unselected cells may occur when the terminal BL is selected (depending upon the chosen bias conditions during program mode).

In the configuration described in the IEEE JSSC paper, the cell was configured as a memory array element. The advantage of the cell 10 was that it could be fabricated without significant changes from a standard CMOS logic process. A standard process may provide advantages in cost and yield (i.e., a lower number of masks and a lower time required to fabricate the device as compared with a stacked gate nonvolatile technology).

In a portion of the cell 10 shown in FIG. 1B, a thin oxide layer is shown over the drain region of the transistor 14. Programming and erase takes place in the specially fabricated thin oxide area that has a thickness less than 100 Angstroms, required for Fowler Nordheim (FN) tunneling. FN tunneling is a quantum-mechanical effect which allows electrons to pass through the energy barrier at the silicon-silicon dioxide interface. The energy required for the electrons to pass this barrier is much lower than the energy required for hot electron injection programming. This special tunnel oxide area requires an additional mask during fabrication. Programming and erasing are accomplished by Fowler Nordheim tunneling. Programming for the cell 10 in FIG. 1 was accomplished by raising the control gate terminal to a high voltage (>10V) while the drain terminal is kept at 0V (the terminal BL at 0V, the terminal WL at Vcc). Under programming conditions, electrons tunnel through the thin oxide window from the substrate to the floating gate creating a negative charge on the floating gate, raising the apparent threshold voltage at the terminal CG.

During an erase, the terminal CG is grounded, the terminal BL and the terminal WL are raised to high voltage (say 10V). This sets the drain terminal D to approximately 8V (10V-Vtn). Under these conditions, electrons tunnel through the thin oxide window from the floating gate into the substrate, creating a positive charge on the floating gate. This lowers the apparent threshold voltage at the terminal CG. During a read the terminal CG and the terminal WL are set to Vcc, while the terminal BL is set to a lower voltage to prevent read disturb of the cell state but sufficient to enable a small read current to flow which may be sensed by other sense circuitry (say 0.1V to 1V).

The cell 10 has the disadvantage that it generally requires an additional mask (for the tunnel oxide layer) and requires large terminal voltages, which introduces a risk of breakdown for the n-channel junctions during programming/erase. Additionally, erasing can only be accomplished with the drain terminal D at a high voltage.

SUMMARY OF THE INVENTION

The present invention concerns a nonvolatile cell comprising a first device comprising a first transistor type and a second device comprising a second transistor type. The first device may have a gate, a source, a drain and a gate oxide layer over the gate. The second device may have a gate, a source, a drain and a floating gate formed between the gate of said first device and the gate of the second device. The floating gate may be configured to store a charge in response to (i) a first voltage applied to the source and drain of said first device and (ii) a second voltage applied to the source and drain of the second device.

The objects, features and advantages of the present invention include providing a nonvolatile cell that may (i) be programmed with a zero voltage across the junctions of the p-channel devices, (ii) provide a full programming voltage across an n-well to p-substrate junction, (iii) does not require changes (e.g., additional masks) from a baseline CMOS process, (iv) break the erase bias voltage into a negative voltage and a positive voltage to reduce stresses on the junctions, and/or (v) allow erasing with a single negative erase voltage.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2A:
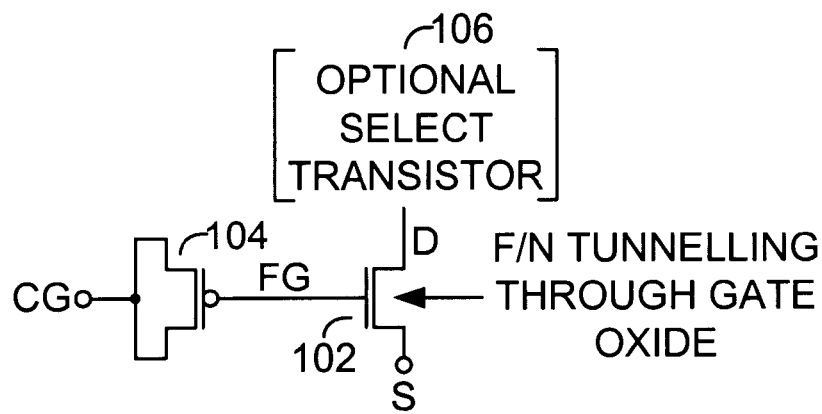
FIGS. 2A and 2B are diagrams of a preferred embodiment of the present invention.

Referring to FIG. 2A, a diagram of a nonvolatile cell 100 is shown in accordance with a preferred embodiment of the present invention. The cell 100 generally comprises an n-channel transistor 102 and a p-channel transistor 104. An optional additional n-channel select transistor 106 may also be implemented. The transistors 102 and 104 (and optionally 106) may be implemented, in one example, in a p-substrate Nwell CMOS submicron technology. However, the transistors 102, 104 and 106 may be implemented, in another example, in a Pwell technology where the polarity of the respective elements would be reversed. For example, the n-channel transistors 102 and 106 would become p-channel devices and the p-channel transistor 104 would become an n-channel device.

Figure 2B:
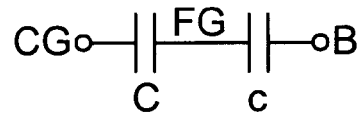

In the case where the cell 100 is implemented in a Pwell technology, the bias conditions for Read/Program/Erase would be different than an implementation in an Nwell technology. Additionally, the cell 100 may be implemented in a "triple well" technology (e.g., where a p-well is available inside an Nwell Tub, which is itself implemented in a P-type substrate). The bias conditions when implemented in a triple well technology may be different from those described for Read/Program/Erase in the context of an Nwell technology. In the example of an Nwell configuration, the n-channel transistor 104 may have a gate coupled to the gate of the p-channel transistor 104, which may form the capacitor floating gate structure which stores a charge. FIG. 2B illustrates the capacitor divider formed between the gate of the transistor 102 and the gate of the transistor 104.

Figure 3A:
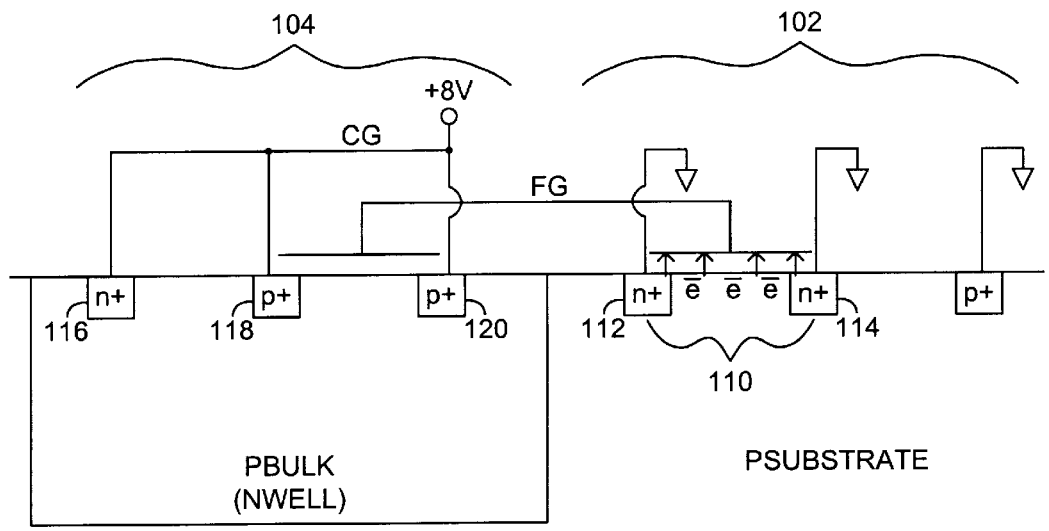
FIGS. 3A and 3B illustrate programming and erasing of the cell of the present invention.
Figure 3B:
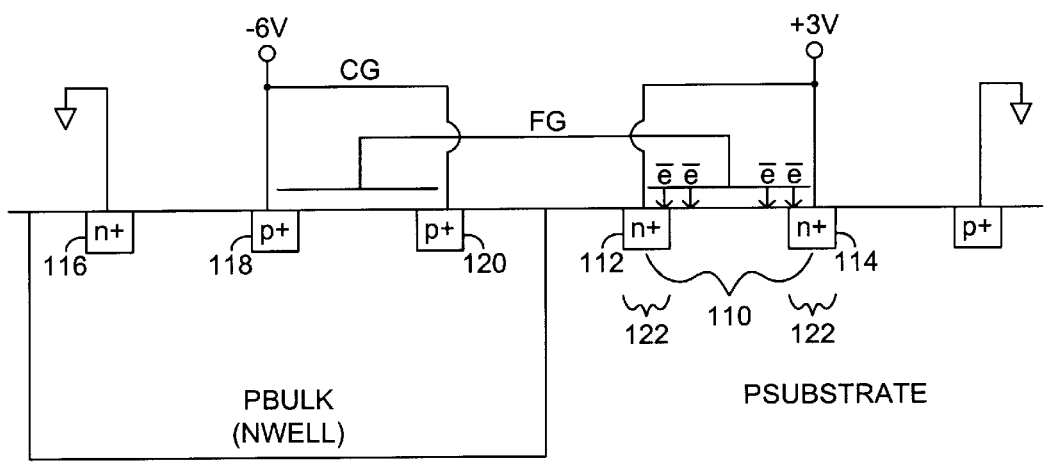

In FIGS. 3A and 3B, the transistor 104 is shown formed in the Nwell that is formed in the p-substrate. The transistor 102 is shown formed in the p-substrate. FIG. 3A illustrates an example of programming of the cell 100 that may be achieved by raising the terminal CG to high voltage (e.g., between 6V and 10V, preferably between 7V and 9V, more preferably 8V). The induced E field generally causes electrons to tunnel from the p-channel substrate through the channel area 110 formed between the source (e.g., the n+ implant 112) and the drain (e.g., the n+ implant 114 of the transistor 102) onto the floating gate FG. The gate oxide in the channel area 110 is generally 10 Å to 65 Å, more preferably 35 Å to 55 Å, more preferably 45 Å and therefore sufficient for Fowler Nordheim programming (i.e., <100 Å). The lower limit of the gate oxide thickness in the channel area may be limited by the particular fabrication process. The resulting negative charge on the floating gate FG generally results in a higher apparent threshold voltage Vt at the terminal CG. The terminal PBULK (i.e., the Nwell) may also be raised to the same voltage, through the n+ implant 116, as the terminal CG during programming (otherwise the p-channel source/drain to Nwell junctions would become forward biased and disrupt the high voltage (8V) generator circuit). The drain terminal D (e.g., 112) and the source terminal S (e.g., 114) of the transistor 102 generally remain grounded during programming to maximize the E-field for optimum programming.

FIG. 3B illustrates an example of an erase operation of the cell 100 that may occur by bringing the terminal CG to a negative erase voltage (e.g., between −4V and −8V, preferably between −5V and −7V, more preferably −6V). The terminal PBULK must be kept at 0V (through the n+ implant 116), otherwise the Nwell to p-substrate diode may become forward biased and interfere with the negative charge pump generation circuits (not shown). During an erase, the terminals D and S are brought to a positive voltage (e.g., between +1V and +5V, preferably between +2V and +4V, most preferably +3V), giving a total potential across the floating gate FG, of −6V−(+3V)=−9V. Electrons may tunnel through the poly overlap of the source/drain (e.g., in the poly overlap of source/drain labeled 122 in FIG. 3B) on the n-channel transistor (since this is where the 9V potential exists), from the poly floating gate FG to the source/drain 112 and 114, thus creating a positive charge on the floating gate FG. This generally results in a lower apparent threshold voltage Vt at the terminal CG. The terminal PBULK must be equal to or greater than the highest source or drain potential (e.g., on the implants 116 and 118) during erase, in this case >=−6V. This generally prevents the source/Nwell diode (e.g., the p+ implant 118) and drain/Nwell diode (e.g., the p+ implant 120) from forward biasing. In addition, the terminal PBULK must generally be no more than a diode drop (e.g., approximately 0.6V) lower than the terminal NBULK. Otherwise, the substrate to Nwell diode may become forward biased. Alternatively, the cell 100 may be erased with a single bias voltage by applying 8V–10V to the drain of the device 102. The gate and drain of optional select device 106 would be at 10V giving $10V_{TN} \approx 8V$ on the terminal BL (i.e., the drain of the device 102). The cell 100 is generally read by applying the supply voltage Vcc to the terminal CG (as well as to the gate terminal of the optional select transistor 106, if present) and a lower voltage to the terminal BL (e.g., the drain terminal D of the transistor 102 if no select transistor is present). The low BL voltage may inhibit disturbing the state of the cell 100 while reading. The terminal BL (e.g., the drain terminal D of the device 102) may be from between 0.1V to 1V during read, which may be sufficient for proper reading.

The current delivered during a read operation depends upon the size of the n-channel floating gate transistor 102 (and select transistor 106, if present) as well as upon the bias voltages on the terminals. A wider transistor generally delivers more read current, which may be desirable for speed and reliability. However, larger transistors may reduce the packing density of the cell and increase die size. In one example, the read current may be 50 $\mu$A. However, read currents between 40 $\mu$A–60 $\mu$A, 30 $\mu$A and 70 $\mu$A, or other appropriate currents may be implemented accordingly to meet the design criteria of a particular application. The size of the device 104 may also affect the read current. As the gate area of the device 104 is increased, the coupling ratio increases and hence the gate bias (FG) on the device 102.

FIG. 4 illustrates the read current for the test device used in an erased state with an Ids/Vgs curve swept with Vds= 0.1V and body bias of 0V. The capacitor floating gate structure is composed of n-channel and p-channel devices.

Figure 4A:
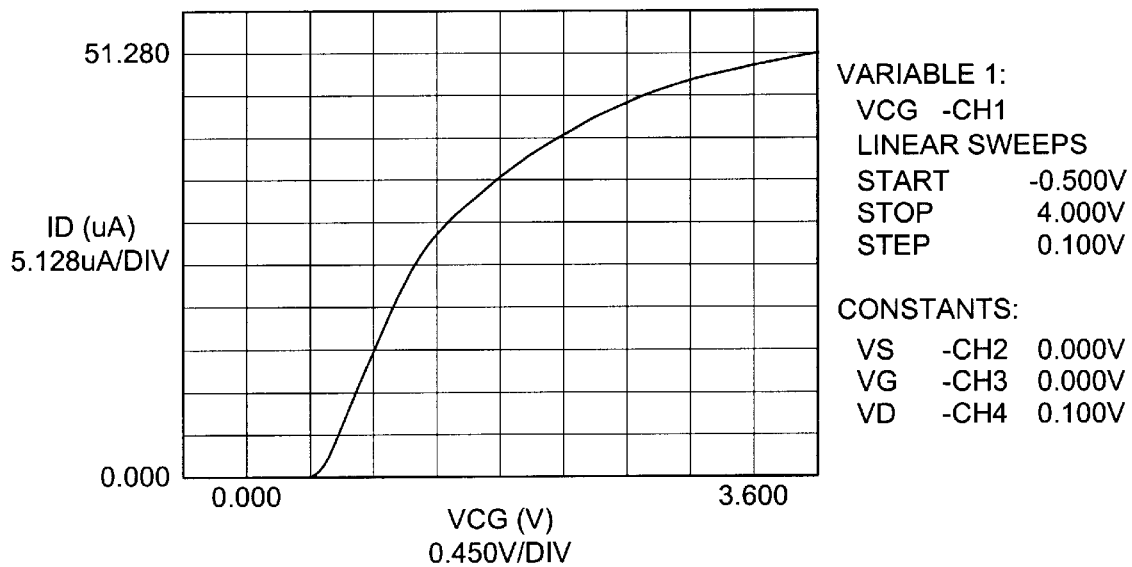
FIG. 4A is a cell in a native state or the state in which the cell will nominally come out of the fabrication process (i.e., an erased state)
Figure 4B:
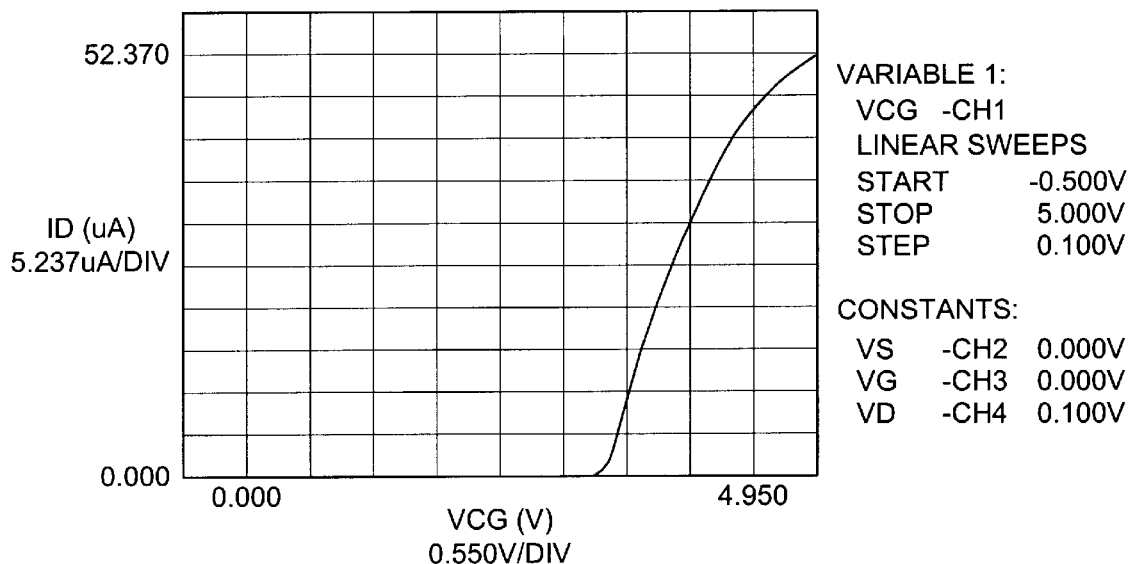
FIG. 4B is a plot of the read current obtained from a programmed cell the Idg/Vgs curve was swept with Vds=0.1V.

FIG. 4B illustrates the "high vt" state which may result from applying the programming bias conditions. This is an I–V sweep under identical conditions to FIG. 4A showing the much reduced read current obtained once the cell 100 is programmed.

During programming, the source and drain junctions of the p-channel device have no voltage across them. This may provide advantages for fewer junction breakdowns in modern sub-micron technologies. Smaller devices mean that junctions must be more strongly graded to improve packing density, this reduces junction breakdown voltages (e.g., approx 9V). Since the voltages required to program the proposed cell are close to the junction breakdown voltage, added robustness and stability may be provided by having zero stress on the p-channel junctions during programming. The full 8V programming voltage may appear across the N-well to p-substrate junction. This Nwell to p-substrate junction may be a junction that is graded less strongly and is rated to have higher junction breakdown (approx 15V). Hence the p-channel transistor 104 provides an advantage over the conventional n-channel transistor 16.

Likewise during erase, the use of a p-channel device may allow negative voltage to be used. This may allow the erase field to be split. For example, −6V may be applied to the gate CG and +3V may be applied to the source and drain, for a total of 9v. This is again desirable since if the circuit designer was forced to generate −9V, the problem with junction breakdown mentioned above would again be a limiting condition and may mean that the cell could not be used in certain technologies. Since the technologies under discussion are designed to work with a 3.3V supply voltage Vcc or lower, the junction breakdowns of 8V to 9V would be expected for these technologies. If the cell 10 of FIG. 1 were implemented in a modern submicron technology, problems with junction breakdown owing to the high voltages across n-channel devices would occur. This would be particularly true since n-channel transistors usually are more susceptible to breakdown than p-channel transistors. When the conventional cell 10 was proposed in 1985, it was implemented in a 2.5 μm 5V technology where junction breakdowns would have been much higher (e.g., 15V–20V).

The cell 100 does not generally require any changes from baseline CMOS logic/RAM process (e.g., no tunnel oxide mask is required). Many CMOS technologies at 0.35 μm and below have gate oxides <100A, which is sufficient for Fowler Nordheim tunneling without modulating the nominal oxide thickness.

In general, the coupling ratio of the cell 100 must be high or the coupling capacitor itself will tunnel (this applies also to the cell 10). This point is illustrated in FIG. 2B where the p-channel device capacitance is represented by the upper case C while the smaller n-channel gate capacitance is represented by the lower case c. Writing a charge neutrality equation for the system, the voltage on the floating gate terminal may be defined by the following equation:

$$VFG=C/(c+C)*(VCG-PBULK) \qquad EQ1$$

Hence provided that the capacitance C (e.g., the gate capacitance attributable to the device 104) is significantly larger than capacitance c (e.g., the gate capacitance attributable to the device 102), then the majority of the voltage applied between VCG and PBULK will appear across the n-channel device and not across the p-channel device, which is the general desired function.

The cell 10 and the cell 100 both have significantly higher coupling ratios than an equivalent cell implemented in a double poly process. This may be the case since no ONO (oxide-Nitride-oxide) layer is required between the two poly layers as is the case for double poly technologies. The coupling ratio may be increased by increasing the size of the p-channel gate with respect to the n-channel floating gate device. This ratio of the p-channel to n-channel sets the coupling ratio. Having a higher coupling ratio may mean that less external applied VCG potential is required to effect programming. However larger devices reduce packing density.

As CMOS technologies continue to shrink from 0.5 μm to below 0.35 μm, to below 0.25 μm, the gate oxide continues to become thinner (e.g., to preserve Ids (sat) and E-field strengths from generation to generation). The thinning of the gate oxide is unavoidable in higher density CMOS technologies. The advantage for the cell 100 is that the thinner gate oxide may result in programming that requires less voltage.

Figure 1A:
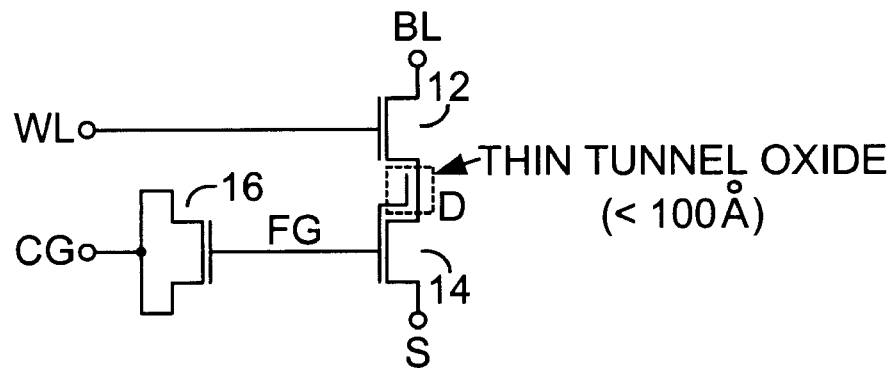
FIGS. 1A and 1B are diagrams of a conventional nonvolatile cell in a logic process.
Figure 1B:
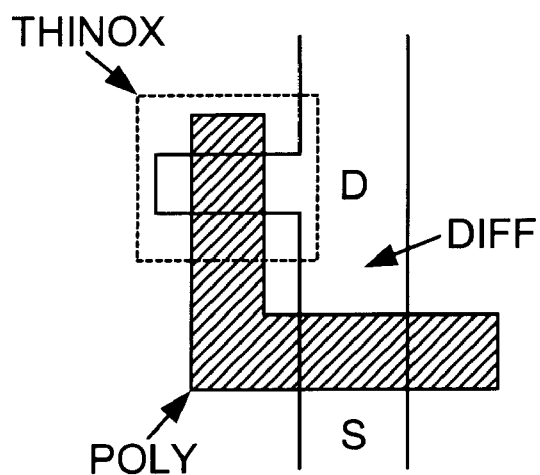

The cell 10 of FIG. 1 was proposed in the 1980's when CMOS technology had minimum poly feature sizes of 2.5 μm to 5 μm with gate oxides between 350 Å and 500 Å (approximate values). The fabrication technology to produce <100 Å gate oxides was in the early stages of development and hence required an additional new mask to define the <100 Å gate oxide window. In a modern technology, the gate oxide is less than 100 Å anyway for unrelated reasons (described above), which the cell 100 uses to its advantage.

The present invention may be useful as (i) a fuse element where the device may be a logic/memory/microprocessor/ mixed signal/analog or other device (e.g., alter device performance in a post-fabrication environment), (ii) an on board non-volatile memory portion of a Universal Serial Bus (USB) device, (iii) a PPD CPLD/PLD/FLASH, and/or (iv) MPD $E^2$ array. Furthermore, the fuse may be used in a memory chip (e.g., SRAM/DRAM/FLASH/$E^2$/PROM/ EPROM/CPLD) to repair memory segments in the memory matrix which may have suffered damage during fabrication with spare (e.g., redundant) or additional blocks of memory cells provided for that purpose.

While the invention has been particularly shown and described with reference to the preferred embodiments thereof, it will be understood by those skilled in the art that various changes in form and details may be made without departing from the spirit and scope of the invention.

What is claimed is:

1. A nonvolatile cell comprising:
    a first device comprising a first transistor type, said first device having a gate, a source, a drain and a gate oxide layer over said gate;
    a second device comprising a second transistor type said second device having a gate, a source and a drain; and
    a floating gate formed between said gate of said first device and said gate of said second device, wherein said floating gate is configured to store a charge in response to (i) a first voltage applied to said source and drain of said first device, wherein said first voltage is a positive voltage during programming of said cell and a negative voltage during erasing of said cell and (ii) a second voltage applied to said source and drain of said second device, wherein said second voltage is a voltage at ground during programming of said cell and a positive voltage during erasing of said cell.

2. The cell according to claim 1, wherein said charge is stored in response to electrons tunneling through said gate oxide layer.

3. The cell according to claim 1, wherein said first transistor type comprises an n-channel device.

4. The cell according to claim 3, wherein said second transistor type transistor comprises a p-channel device.

5. The cell according to claim 4, wherein said first and second devices are formed in a p-substrate.

6. The cell according to claim 5, further comprising an Nwell formed in said p-substrate wherein said second device is formed in said Nwell.

7. The cell according to claim 1, wherein said first transistor type comprises a p-channel device.

8. The cell according to claim 1, wherein said second transistor comprises an n-channel device.

9. The cell according to claim 1, wherein said first device further comprises a drain coupled to a third device, wherein said third transistor comprises a select transistor.

10. The cell according to claim 9, wherein said third device comprises said second transistor type.

11. The cell according to claim 2, wherein said tunneling comprises FN tunneling.

12. The cell according to claim 1, wherein said gate oxide layer is of a thickness sufficient to allow tunneling during programming.

13. The cell according to claim 12, wherein said gate oxide thickness is between 10 Å and 65 Å.

14. The cell according to claim 12, wherein said gate oxide thickness is 45 Å.

15. The cell according to claim 19, wherein:
    said first voltage is a positive voltage and said second voltage is zero during programming of said cell; and
    said first voltage is negative and said second voltage is positive during erasing of said cell.

16. The cell according to claim 1, wherein:

said first voltage is between 6 volts and 10 volts and said second voltage is zero during programming of said cell; and said first voltage is a negative voltage between −4 volts and −8 volts and said second voltage is a positive voltage between 1 volt and 5 volts during erasing of said cell.

17. The cell according to claim 1, wherein:

said first voltage is about 8 volts and said second voltage is about zero during programming of said cell; and said first voltage is negative voltage about −6 volts and said second voltage is positive voltage about 3 volts during erasing of said cell.

18. A method for forming nonvolatile cell comprising the steps of:

(A) forming a first device having a gate, a source, a drain and a gate oxide layer over said gate and a second device having a gate, a source and a drain, wherein the first device is of a first transistor type and the second device is of a second transistor type;

(B) forming a floating gate between said gate of said first device and said gate of said second device, wherein said floating gate is configured to store a charge in response to (i) a first voltage applied to said source and drain of said first device, wherein said first voltage is a positive voltage during programming of said cell and a negative voltage during erasing of said cell and (ii) a second voltage applied to said source and drain of said second device, wherein said second voltage is a voltage at ground during programming of said cell and a positive voltage during erasing of said cell.

19. A nonvolatile cell comprising:

a first device comprising a first transistor type, said first device having a gate, a source, a drain and a gate oxide layer over said gate, wherein said gate oxide thickness is between 10 Å and 65 Å;

a second device comprising a second transistor type said second device having a gate, a source and a drain; and a floating gate formed between said gate of said first device and said gate of said second device, wherein said floating gate is configured to store a charge in response to (i) a first voltage applied to said source and drain of said first device and (ii) a second voltage applied to said source and drain of said second device.

* * * * *